United States Patent
Kusazaki et al.

(10) Patent No.: US 11,516,923 B2
(45) Date of Patent: Nov. 29, 2022

(54) ELECTRONIC COMPONENT MOUNTING SUBSTRATE AND MANUFACTURING METHOD THEREOF

(71) Applicant: KOITO MANUFACTURING CO., LTD., Tokyo (JP)

(72) Inventors: Shinya Kusazaki, Shizuoka (JP); Hiroki Ishibashi, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 294 days.

(21) Appl. No.: 16/867,622

(22) Filed: May 6, 2020

(65) Prior Publication Data

US 2020/0367365 A1   Nov. 19, 2020

(30) Foreign Application Priority Data

May 15, 2019   (JP) .............................. JP2019-092418

(51) Int. Cl.
| H05K 3/32 | (2006.01) |
| H05K 3/34 | (2006.01) |
| H05K 1/18 | (2006.01) |
| H05K 1/11 | (2006.01) |
| H05K 13/04 | (2006.01) |
| F21S 41/151 | (2018.01) |

(52) U.S. Cl.
CPC ............ *H05K 3/321* (2013.01); *F21S 41/151* (2018.01); *H05K 1/111* (2013.01); *H05K 1/181* (2013.01); *H05K 3/3431* (2013.01); *H05K 13/0469* (2013.01); *H05K 2201/10106* (2013.01); *H05K 2201/10984* (2013.01); *H05K 2203/0465* (2013.01)

(58) Field of Classification Search
CPC ...... H05K 3/321; H05K 3/3431; H05K 1/111; H05K 1/181; H05K 13/0469; H05K 2201/10106; H05K 2201/10984; H05K 2203/0465; F21S 41/151
See application file for complete search history.

(56) References Cited

U.S. PATENT DOCUMENTS

| 4,314,870 A * | 2/1982 | Ishida .................... H01L 24/29 228/175 |
| 2002/0072151 A1 | 6/2002 | Amami et al. |
| 2004/0235221 A1 | 11/2004 | Taguchi et al. |
| 2015/0124411 A1 | 5/2015 | Iihola et al. |

FOREIGN PATENT DOCUMENTS

| EP | 1219693 A1 | 7/2002 |
| JP | H09-139559 A | 5/1997 |
| JP | 2015-056228 A | 3/2015 |
| JP | 2019-021799 A | 2/2019 |

OTHER PUBLICATIONS

English Machine Translation of JP 2006165088, Shoda et al., published Jun. 22, 2006.*

* cited by examiner

*Primary Examiner* — Peniel M Gumedzoe
(74) *Attorney, Agent, or Firm* — Venjuris, P.C.

(57) ABSTRACT

An electronic component mounting substrate includes an electronic component and a substrate that are electrically connected at a plurality of places on a bottom surface of the electronic component. At least two places of the plurality of places are electrically connected by bonding using a conductive adhesive, and places other than the at least two places of the plurality of places are electrically connected by soldering using a paste solder.

14 Claims, 10 Drawing Sheets

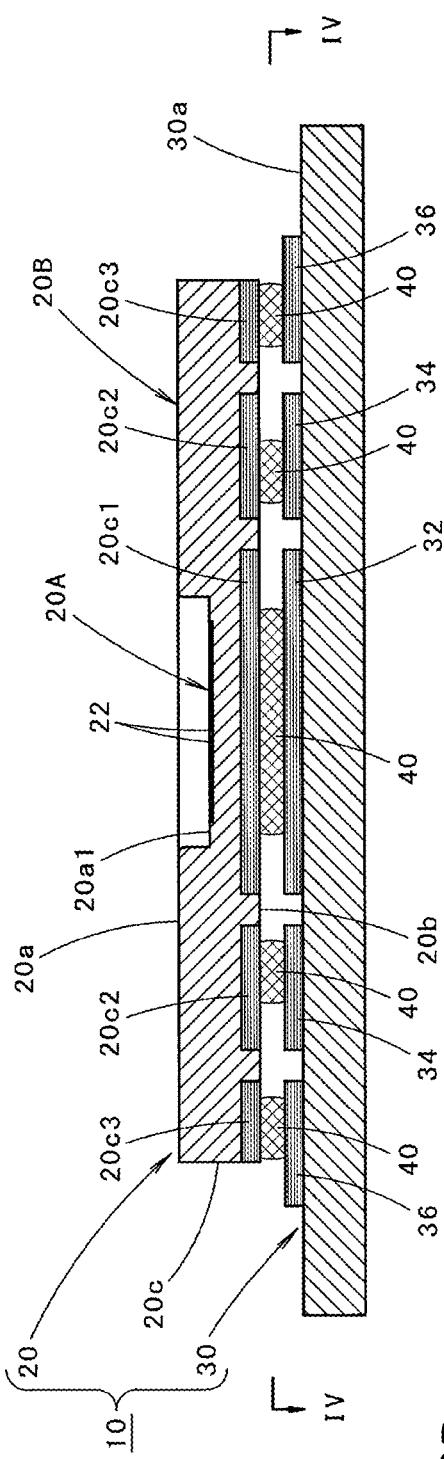
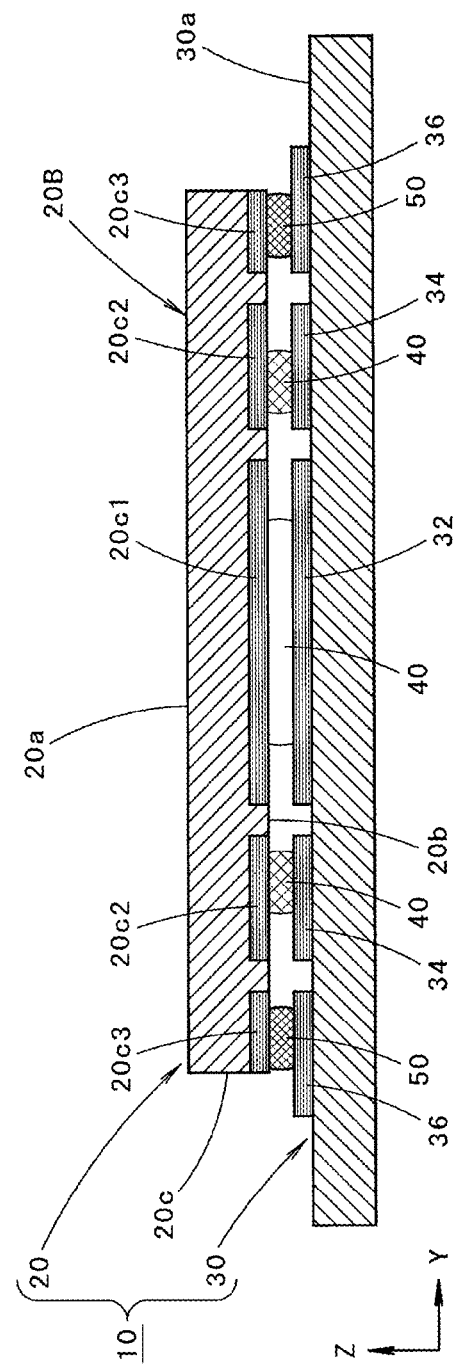

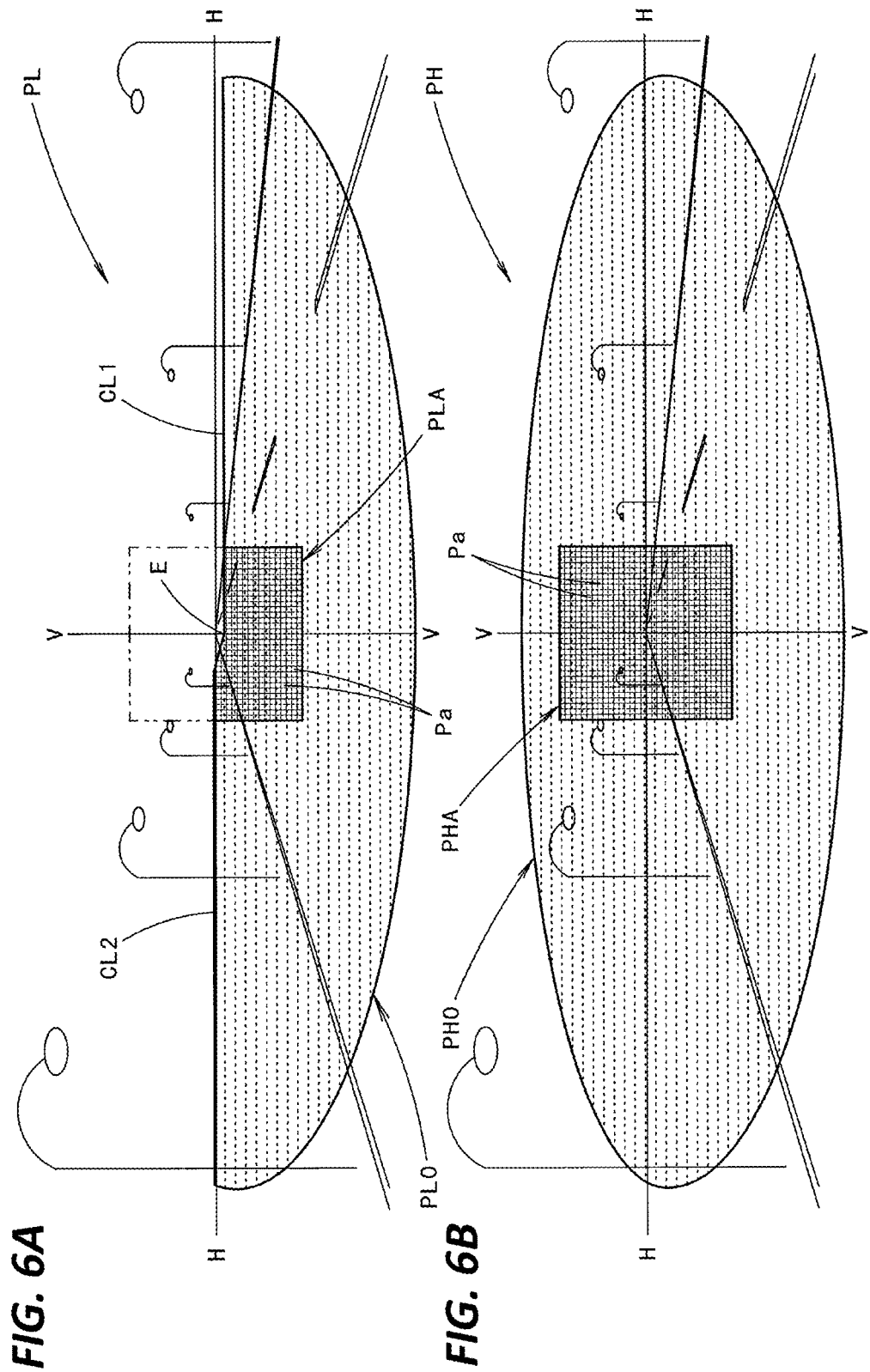

ELECTRONIC COMPONENT MOUNTING SUBSTRATE AND MANUFACTURING METHOD THEREOF

CROSS-REFERENCE TO RELATED APPLICATIONS

This application is based on and claims priority from Japanese Patent Application No. 2019-092418, filed on May 15, 2019, with the Japan Patent Office, the disclosure of which is incorporated herein in its entirety by reference.

TECHNICAL FIELD

The present disclosure relates to an electronic component mounting substrate in which an electronic component and a substrate are electrically connected at a plurality of places on a bottom surface of the electronic component, and a method for manufacturing the same.

BACKGROUND

In the related art, an electronic component mounting substrate in which an electronic component such as an IC chip or a light emitting diode is mounted on a substrate is known, for example, as disclosed in Japanese Patent Laid-Open Publication Nos. 2019-021799 and 2015-056228.

In such an electronic component mounting substrate, the electronic component and the substrate are electrically connected by soldering at a plurality of places on a bottom surface of the electronic component. The soldering is performed by so-called a reflow processing in which a solder in a paste phase is supplied to the plurality of places on the substrate, and the solder is heated and melted in a state where the electronic component is mounted thereon.

SUMMARY

The electronic component mounting substrate in the related art has the following problems.

That is, when soldering the electronic component and the substrate with each other by the reflow processing, the solder is in a liquid phase and tends to be spread on the substrate. Due to the surface tension of the solder generated at this time, the electro component is easily moved. As a result, the electronic component is shifted from an intended mounting position, and may not be able to perform its original function as the electronic component.

The present disclosure has been made in consideration of such circumstances, and is to provide an electronic component mounting substrate and a method for manufacturing the same capable of improving mounting position accuracy of an electronic component, in an electronic component mounting substrate in which an electronic component and a substrate are electrically connected by soldering at a plurality of places on a bottom surface of the electronic component.

The present disclosure solves the above problems by researching on means for electrical connection of an electronic component and a substrate.

That is, in an electronic component mounting substrate according to the present disclosure, an electronic component and a substrate are electrically connected at a plurality of places on a bottom surface of the electronic component. At least two places of the plurality of places are electrically connected by bonding using a conductive adhesive, and places other than the at least two places are electrically connected by soldering.

A type of the "electronic component" is not particularly limited, and examples thereof include a light emitting diode, a sensor chip, and an IC chip.

A specific composition of the "conductive adhesive" is not particularly limited as long as the adhesive has conductivity.

A specific number or arrangement of the "at least two places" is not particularly limited.

In the electronic component mounting substrate according to the present disclosure, the electronic component and the substrate are electrically connected at the plurality of places on the bottom surface of the electronic component. However, the electrical connections at at least two places of the plurality of places are performed by bonding using a conductive adhesive instead of soldering, and thus, the following operation effect may be obtained.

That is, when soldering the electronic component and the substrate by a reflow processing, even if the solder in a liquid phase tends to be spread on the substrate and the surface tension thereof acts on the electronic component, the electronic component is also fixed to the substrate by the bonding using a conductive adhesive, and thus, it is possible to suppress in advance the electronic component from being shifted from an intended mounting position.

At this time, since the electrical connection by the bonding using a conductive adhesive is performed at at least two places, it is possible to not only suppress the electronic component from shifting from the intended mounting position in the translation direction, but also to suppress the shift in the rotation direction. Then, therefore, it is possible to improve the mounting position accuracy of the electronic component.

As described above, according to the present disclosure, it is possible to improve the mounting position accuracy of the electronic component in the electronic component mounting substrate in which the electronic component and the substrate are electrically connected at the plurality of places on the bottom surface of the electronic component.

In addition, the following operation effect may be obtained by using both soldering and bonding using a conductive adhesive as means for electrical connection as in the present disclosure.

That is, when all of the electrical connections at the plurality of places are performed by the bonding using a conductive adhesive, it is possible to improve the mounting position accuracy of the electronic component. However, electrical connection by the bonding using a conductive adhesive requires a higher manufacturing cost than electrical connection by soldering. Therefore, by using both the soldering and the bonding using a conductive adhesive, it is possible to improve the mounting position accuracy of the electronic component while suppressing the manufacturing cost of the electronic component mounting substrate.

In the above configuration, when the at least two places are set to two places positioned opposite to each other with respect to a central position of the bottom surface of the electronic component, the electrical connection by the bonding using a conductive adhesive is performed at two places far apart from each other. Thus, it is possible to improve the mounting position accuracy of the electronic component while minimizing the number of places where the electrical connection by the bonding using a conductive adhesive is applied.

At this time, when the at least two places are set to four places at four corners in a diagonal positional relationship with each other with respect to the central position of the bottom surface of the electronic component, it is possible to maximize the mounting position accuracy of the electronic component without unnecessarily increasing the number of places where the electrical connection by the bonding using a conductive adhesive is applied.

In the above configuration, the following operation effect may be obtained by fixing the electronic component to the substrate by the bonding using a conductive adhesive at the central position of the bottom surface of the electronic component.

That is, since it is possible to easily secure a relatively large bonding area at the central position of the bottom surface of the electronic component, it is possible to easily secure the adhesion able to withstand the surface tension of the solder acting on the electronic component. Therefore, it is possible to sufficiently improve the mounting position accuracy of the electronic component by adopting such the configuration.

In addition, when supplying a conductive adhesive to the at least two places, it is possible to supply the conductive adhesive to the central position of the bottom surface of the electronic component at the same time. Thus, the above operation effect may be obtained without preparing a new operation processing.

When adopting the configuration in which the electronic component is fixed to the substrate at the central position of the bottom surface of the electronic component by the bonding using a conductive adhesive, the electrical connection between the electronic component and the substrate may be performed by this fixing, or such electrical connection may not be performed.

In the above configuration, when an organic binder having a thermosetting temperature lower than a melting point of the solder used in soldering is used as an organic binder of the conductive adhesive, during the reflow processing, it is possible to reliably fix the electronic component to the substrate by the bonding using the conductive adhesive before the solder becomes a liquid phase. Thus, it is possible to further improve the mounting position accuracy of the electronic component.

In the above configuration, the following operation effect may be obtained by forming first land portions at positions corresponding to the at least two places on the substrate and forming second land portions at positions corresponding to the positions other than the at least two places, and then, forming the first land portions to have an area smaller than that of the second land portions.

That is, since the bonding using the conductive adhesive is performed to be harder than the soldering, the area of the interface required for bonding may be relatively small. Therefore, even when the first land portion is formed to have an area smaller than that of the second land portion, the necessary bonding strength may be secured. Then, by adopting this configuration, it is possible to easily secure a space for mounting other electronic components on the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3A is a cross-sectional view taken along line IIIa-IIIa in FIG. 2, and FIG. 3B is a cross-sectional view taken along line IIIb-IIIb in FIG. 2.

FIGS. 6A and 6B are views illustrating a light distribution pattern formed by irradiation light from the lamp unit together with a light distribution pattern formed by irradiation pattern from another lamp unit.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

Hereinafter, an embodiment of the present disclosure will be described with reference to drawings.

First, a first embodiment of the present disclosure will be described.

Figure 1:
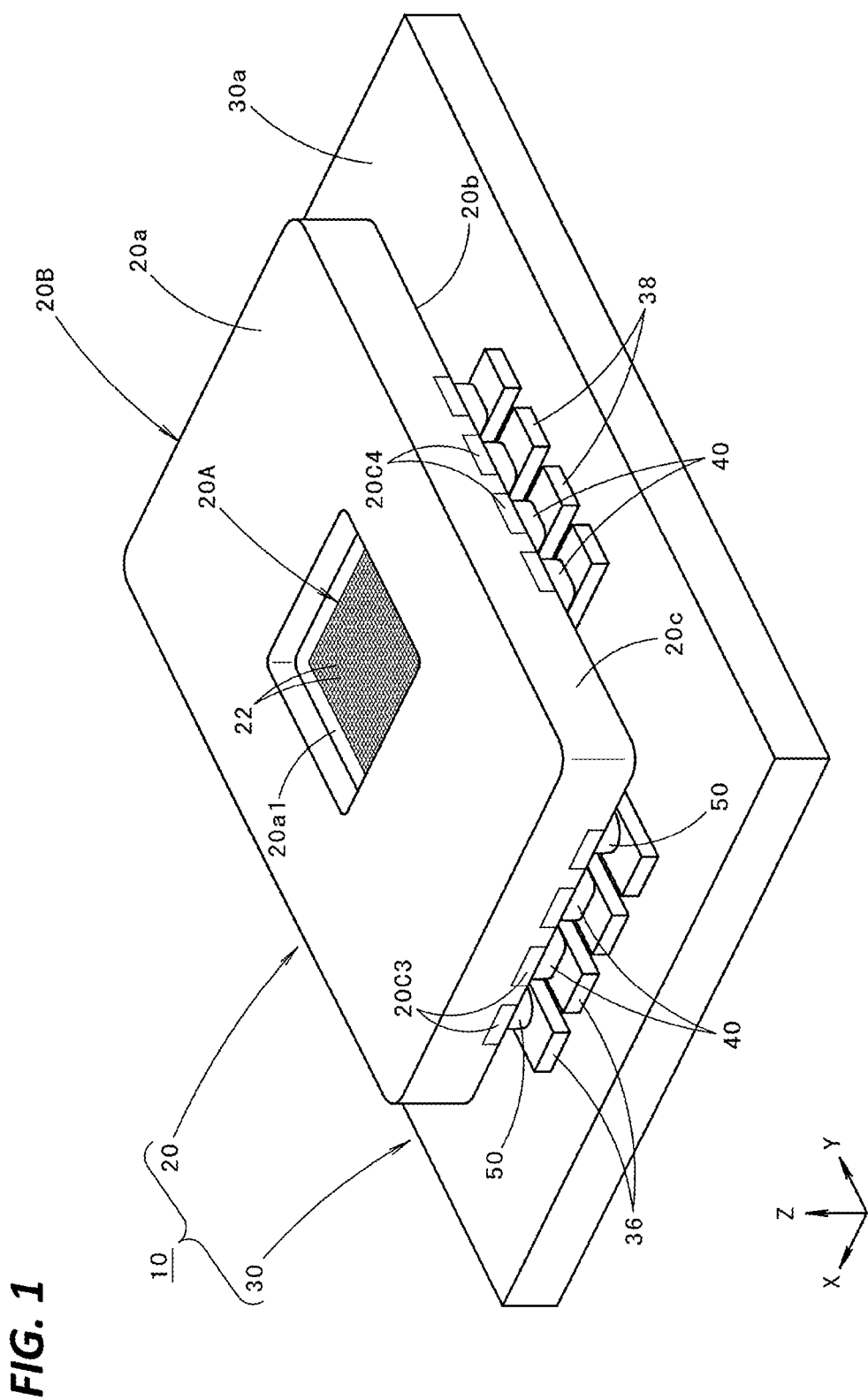
FIG. 1 is a perspective view illustrating an electronic component mounting substrate according to a first embodiment of the present disclosure.
Figure 2:
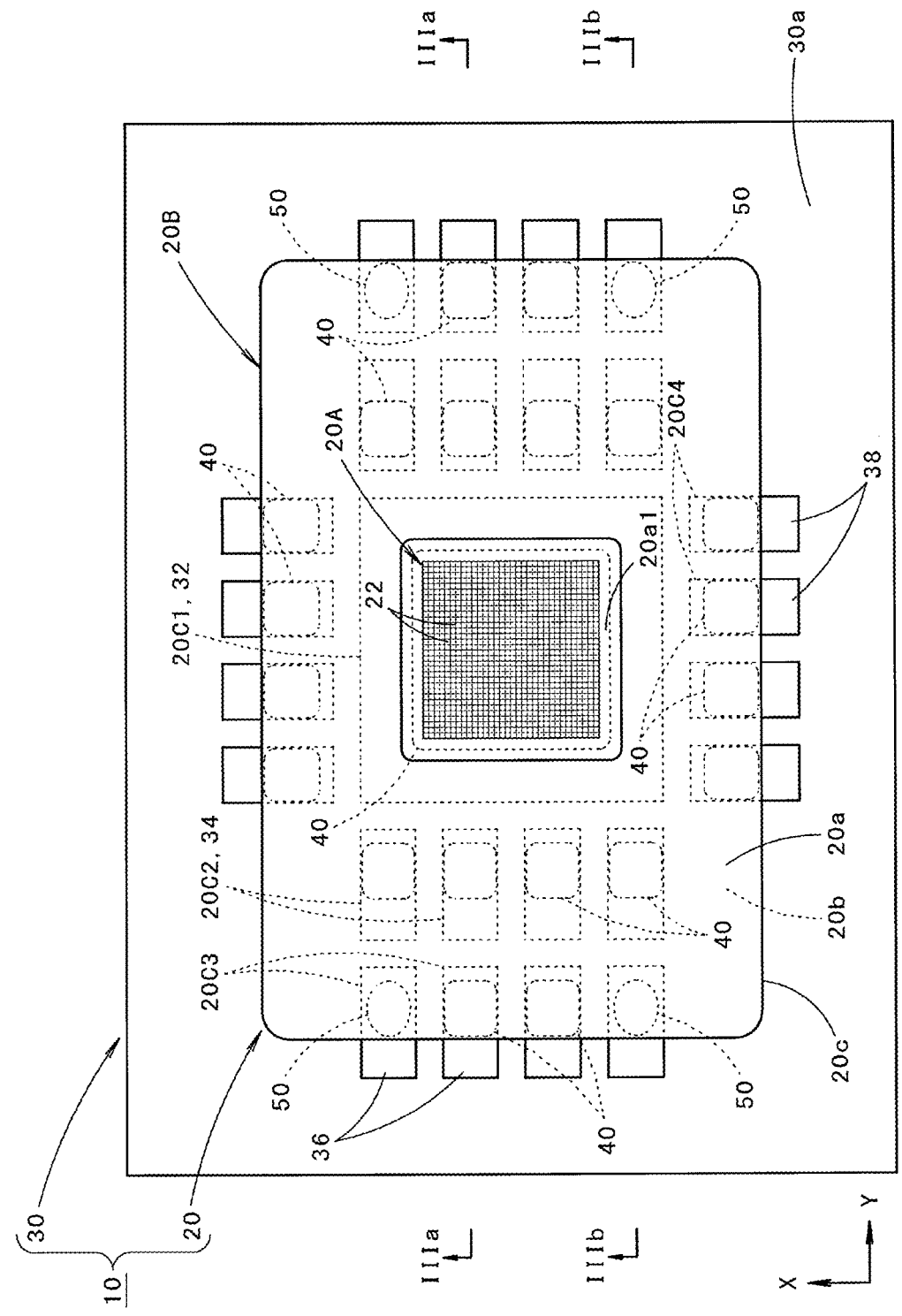
FIG. 2 is a plan view illustrating the electronic component mounting substrate.
Figure 4:
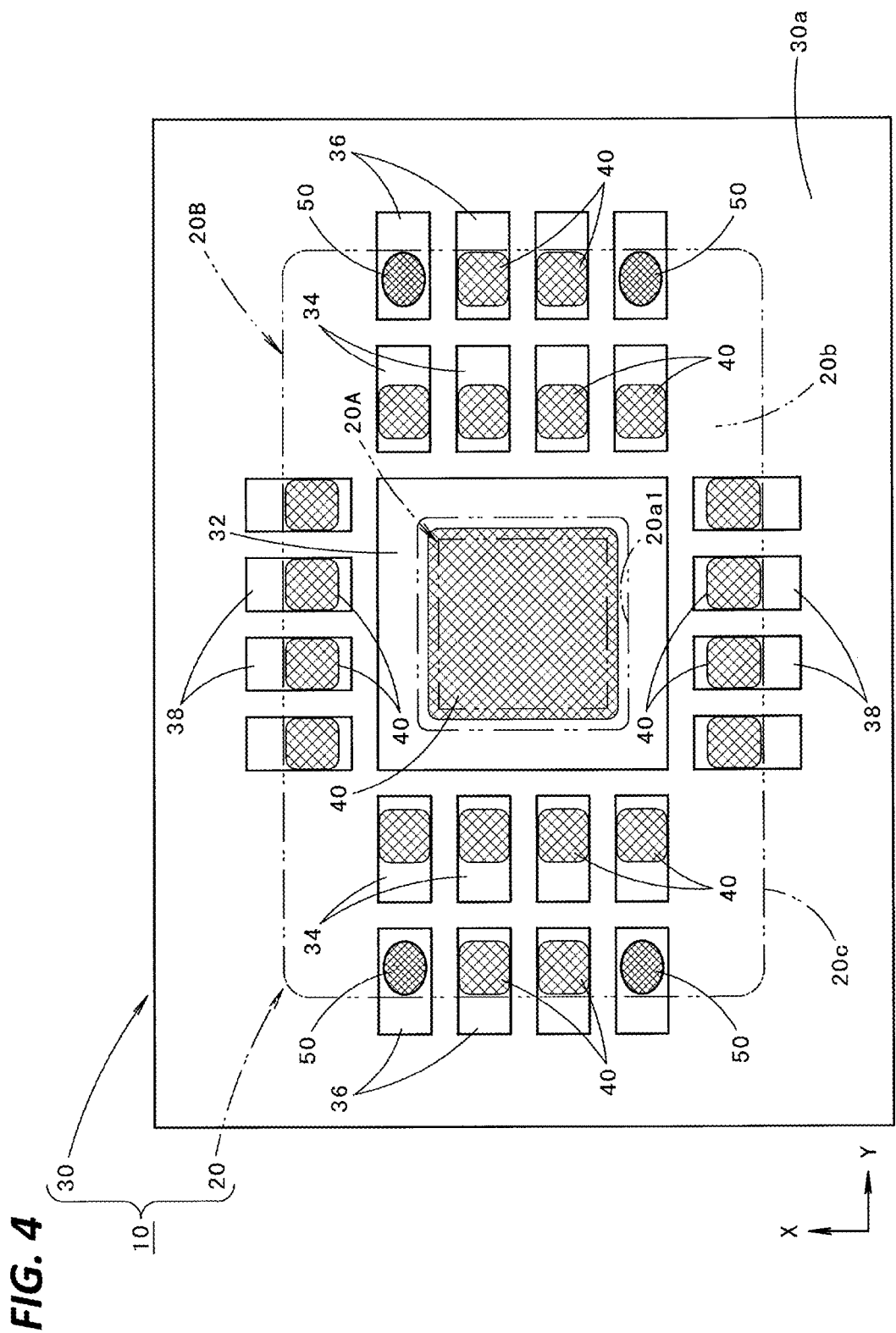
FIG. 4 is a cross-sectional view taken along line IV-IV in FIG. 3A.

FIG. 1 is a perspective view illustrating an electronic component mounting substrate 10 according to the present embodiment, and FIG. 2 is a plan view illustrating the electronic component mounting substrate 10. Further, FIG. 3A is a cross-sectional view taken along line IIIa-IIIa in FIG. 1, and FIG. 3B is a cross-sectional view taken along line IIIb-IIIb in FIG. 2. FIG. 4 is a cross-sectional view taken along line IV-IV of FIG. 3A.

In the following, for convenience, a direction indicated by X will be described as "front" of the electronic component mounting substrate 10, a direction indicated by Y will be described as "right side" thereof, and a direction indicated by Z will be described as "upward" thereof. The same are applied to other drawings.

As illustrated in FIGS. 1 to 4, the electronic component mounting substrate 10 according to the present embodiment has a configuration in which an electronic component 20 and a substrate 30 are electrically connected at a plurality of places on a bottom surface 20b of the electronic component 20.

The electronic component 20 is a light emitting unit, and has a configuration in which a square light emitting area 20A is formed in a central portion of a housing 20B having a horizontally long rectangular outer shape.

The light emitting area 20A is disposed in a recessed portion 20a1 formed in a central portion of an upper surface 20a of the housing 20B. The light emitting area 20A is configured by disposing a plurality (e.g., 900 to 1,600) of light emitting diodes 22 in a vertical and horizontal lattice.

Then, in this light emitting area 20A, a part of or all of the plurality of light emitting diodes 22 may be turned ON.

As illustrated in FIG. 2, metal pads 20C1, 20C2, 20C3, and 20C4 are formed at a plurality of places on the bottom surface 20b of the electronic component 20.

One metal pad 20C1 is formed in the central portion of the bottom surface 20b of the housing 20B. The metal pad 20C1 has a square outer shape much larger than the light emitting area 20A.

The metal pads 20C2 are formed at eight places in four front-rear rows at both left and right sides of the metal pad 20C1. Each of the metal pads 20C2 has a horizontally long rectangular outer shape, and is disposed at an equal distance with each other in the front-rear direction.

At this time, front-rear end edge positions of the entire four metal pads 20C2 disposed in four front-rear rows substantially coincide with front-rear end edge positions of an outer peripheral edge of the metal pad 20C1. Further, the distance between each metal pad 20C2 and the metal pad 20C1 is set to a value substantially equal to the mutual distance between the metal pads 20C2.

The metal pads 20C3 are formed at eight places in four front-rear rows at both left and right sides of the metal pads 20C2.

At this time, each of the metal pads 20C3 has a front-rear width equal to that of the metal pad 20C2 and also has a horizontally long rectangular outer shape closer to a square than the metal pad 20C2. An end surface of the metal pad 20C3 is formed to be on the same plane with an outer peripheral surface 20c of the housing 20B. Then, each of the metal pads 20C3 is disposed at an equal distance with each other in the front-rear direction, and the distance between each metal pad 20C3 and each metal pad 20C3 is also set to a value substantially equal to the mutual distance between the metal pads 20C3.

The metal pads 20C2 are formed at eight places in four left-right rows at both front and rear sides of the metal pad 20C1.

Each of the metal pads 20C4 has a left-right width equal to that of the metal pad 20C2 and also has a vertically long rectangular outer shape closer to a square than the metal pad 20C2. An end surface of the metal pad 20C3 is formed to be on the same plane with the outer peripheral surface 20c of the housing 20B. Then, each of the metal pads 20C4 is disposed at an equal distance with each other in the left-right direction, and the distance between each metal pad 20C4 and each metal pad 20C1 is also set to a value substantially equal to the mutual distance between the metal pads 20C4.

The substrate 30 has a horizontally long rectangular outer shape much larger than the electronic component 20, and land portions 32, 34, 36, and 38 are formed at a plurality of places on an upper surface 30a of the substrate 30. At this time, each of the plurality of land portions 32, 34, 36 and 38 is formed at a position corresponding to each of the plurality of metal pads 20C1, 20C2, 20C3, and 20C4. Each of the land portions 32, 34, 36, and 38 is made of, for example, copper foil.

One land portion 32 is formed in the central portion of the substrate 30. The land portion 32 has a square outer shape having the same size as the metal pad 20C1.

The land portions 34 are formed at eight places in four front-rear rows at both left and right sides of the land portion 32. Each of the land portions 34 has a horizontally long rectangular outer shape, and is disposed at an equal distance with each other in the front-rear direction. At this time, front-rear end edge positions of the entire four land portions 34 disposed in four front-rear rows substantially coincide with front-rear end edge positions of an outer peripheral edge of the land portion 32. Further, the distance between each land portion 34 and the land portion 32 is set to a value substantially equal to the mutual distance between the land portions 34.

The land portions 36 are formed at eight places in four front-rear rows at both left and right sides of the land portions 34. Each of the land portions 36 has the same outer shape as the land portions 34, and is disposed at an equal distance with each other in the front-rear direction. Further, the distance between each land portion 36 and each land portion 34 is set to a value substantially equal to the mutual distance between the land portions 36.

The land portions 38 are formed at eight places in four left-right rows at both front and rear sides of the land portion 32. Each of the land portions 38 has the vertically long rectangular outer shape having the same size as the land portions 34, and is disposed at an equal distance with each other in the left-right direction. Further, the distance between each land portion 38 and each land portion 32 is set to a value substantially equal to the mutual distance between the land portions 38.

When the electronic component 20 is mounted on the substrate 30, the land portions 36 and 38 at sixteen places of the land portions 34, 36, and 38 at twenty four places are configured to be partially protruded from the outer peripheral surface 20c of the electronic component 20.

The electrical connection between the electronic component 20 and the substrate 30 is performed between the metal pads 20C2, 20C3, and 20C4 at the twenty four places and the land portions 34, 36, and 38 at the twenty four places.

Among the electrical connections at these twenty four places, the electrical connections between the metal pads 20C3 at four places at four corners in a diagonal positional relationship with each other with respect to the central position of the bottom surface 20b of the electronic component and the land portions 36 at four places corresponding thereto are performed by the bonding using a conductive adhesive 50, and the other electrical connections at the twenty places are performed by soldering.

At this time, a sintered paste in which fine particles of tin and copper are dispersed in an organic binder such as an epoxy resin is used as the conductive adhesive 50. The conductive adhesive 50 uses an organic binder having a thermosetting temperature (e.g., approximately 200° C.) lower than a melting point (e.g., approximately 220° C.) of the solder 40 used for soldering.

As illustrated in FIG. 4, the electrical connection between the electronic component 20 and the substrate 30 is performed at each of the land portions 34, 36, and 38 at the twenty four places, at a position displaced from the central position thereof toward the land portion 32.

The electrical connection is performed by supplying the solder 40 in a paste phase to the land portions 34, 36, and 38 (i.e., positions to be soldered) at the twenty places excluding the four places at the four corners and supplying the conductive adhesive 50 to the land portions 36 (i.e., positions to be bonded) at the four places at the four corners, and then, mounting the electronic component 20 on the substrate 30, and executing a processing in which the substrate 30 and the electronic component 20 are put into a reflow furnace and heated in this state (i.e., a reflow processing). During the reflow processing, the organic binder of the conductive adhesive 50 supplied to the four places is cured and bonded, and then, the solder 40 supplied to the remaining twenty places is melted and soldered.

Separately from the electrical connection, the electronic component 20 is fixed to the substrate 30 by soldering at the central position of the bottom surface 20b of the electronic component 20. The soldering is performed in the square area having a size substantially the same as the light emitting area 20A.

When supplying the solder 40 in a paste phase to the land portions 34, 36, and 38, the solder 40 is also supplied to the land portion 32 positioned at the central portion of the substrate 30, so that the soldering is performed by the subsequent mounting of the electronic component 20 and the reflow processing.

As described above, the electronic component 20 is soldered to the substrate 30 at the central position of the bottom surface 20b thereof, thereby radiating the heat generated in the electronic component 20 to the substrate 30 via the solder 40.

Figure 5:
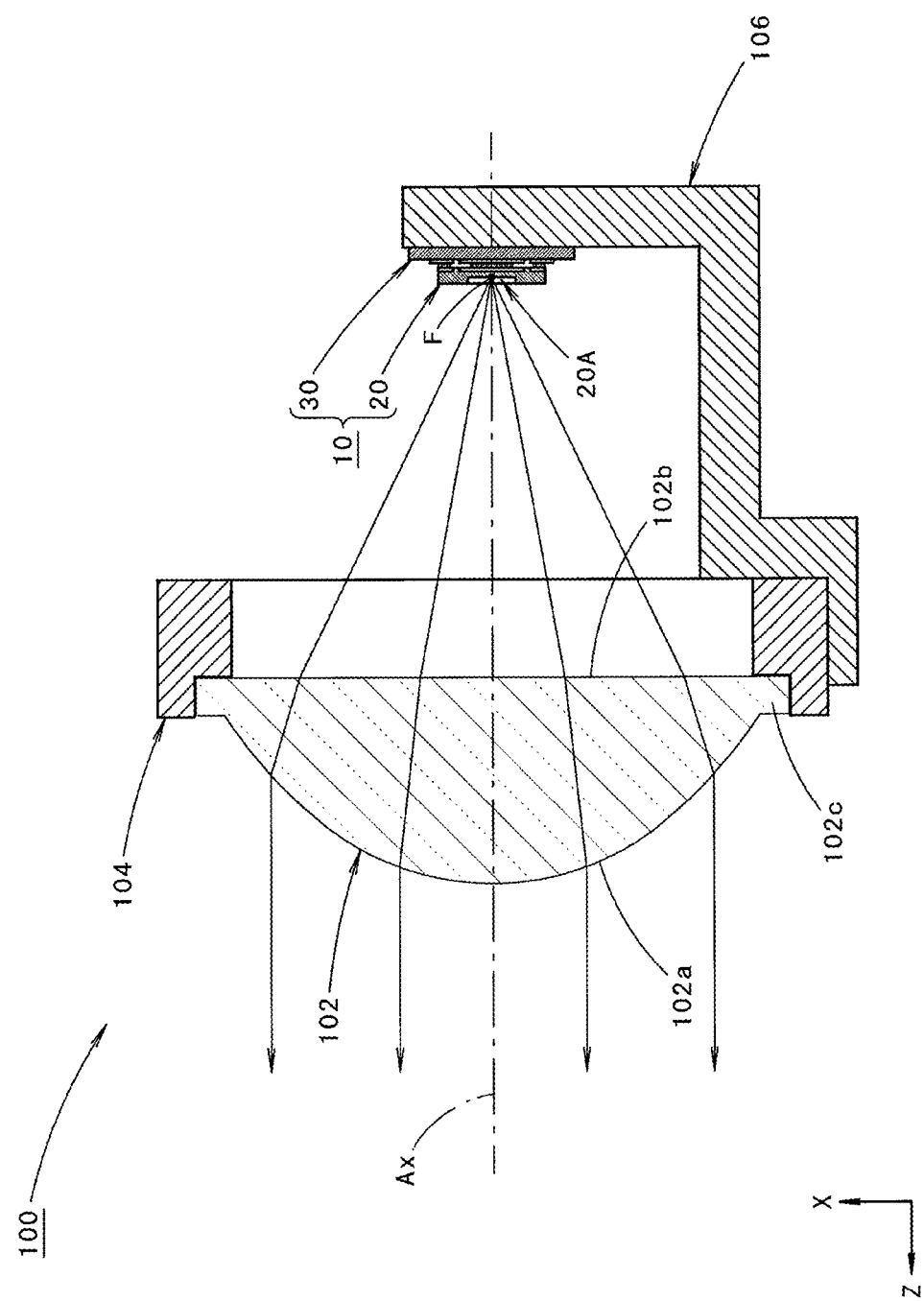
FIG. 5 is a side cross-sectional view illustrating a lamp unit in which the electronic component mounting substrate is provided.

FIG. 5 is a side cross-sectional view illustrating a lamp unit 100 of a vehicle headlamp in which the electronic component mounting substrate 10 according to the present embodiment is provided as a light source module.

As illustrated in FIG. 5, in the lamp unit 100, a direction indicated by Z is "front" (also "front" in a vehicle), and a direction indicated by X is "upward." That is, in the lamp unit 100, "front" of the electronic component mounting substrate 10 is "upward," and "upward" of the electronic component mounting substrate 10 is "front."

The lamp unit 100 is configured as a direct light control type lamp unit that uses the light emitting area 20A of the electronic component 20 of the electronic component mounting substrate 10 as a light source.

That is, the lamp unit 100 has a configuration including a projection lens 102 having an optical axis Ax extending in a lamp front-rear direction, and the electronic component mounting substrate 10 disposed on the rear side of the lamp unit with respect to the projection lens 102.

The projection lens 102 is a plano-convex aspherical lens in which the front surface 102a is a convex surface and the rear surface 102b is a flat surface, and is configured to project a light source image formed on a rear side focal point plane which is a focal point plane including a rear side focal point F thereof onto a virtual vertical screen in the front of the lamp, as a reversed image. The projection lens 102 has a circular outer shape when viewed from the front of the lamp, and is supported by a lens holder 104 at an outer peripheral flange portion 102c thereof. The lens holder 104 is supported by a base member 106.

The electronic component mounting substrate 10 is disposed in a state where the light emitting area 20A of the electronic component 20 is positioned on the focal point plane including the rear side focal point F of the projection lens 102. Then, the electronic component mounting substrate 10 is supported at the base member 106 by the substrate 30.

FIGS. 6A and 6B are views perspectively illustrating a light distribution pattern formed on the virtual vertical screen disposed at a position 25 m ahead of the vehicle front, by light irradiated from the lamp unit 100 and another lamp unit (not illustrated) toward the front. FIG. 6A is a view illustrating a low beam light distribution pattern PL, and FIG. 6B is a view illustrating a high beam light distribution pattern PH.

The low beam light distribution pattern PL illustrated in FIG. 6A is a low beam light distribution pattern of a left side light distribution, and has cut off lines CL1 and CL2 on the upper end edge thereof which are different in height between the left side and the right side. The cut off lines CL1 and CL2 extend in the horizontal direction with a difference between the left side and the right side at the V-V line as a boundary passing through the H-V which is a vanishing point in vertical direction. A facing lane side portion on the right side of the V-V line is formed as a lower end cut off line CL1, and a own vehicle lane side portion on the left side of the V-V line is formed as an upper end cut off line CL2 which is raised by one tier via an inclined portion from the lower end cut off line CL1.

In the low beam light distribution pattern PL, an elbow point E that is an intersection point of the lower cut off line CL1 and the V-V line is positioned 0.5° to 0.6° below the vanishing point H-V.

The low beam light distribution pattern PL is formed as a combined light distribution pattern of a basic light distribution pattern PL0 formed by irradiation light from another lamp unit (not illustrated) and an additional light distribution pattern PLA formed by irradiation light from the lamp unit 100.

The basic light distribution pattern PL0 is a light distribution pattern that forms a basic shape of the low beam light distribution pattern PL, and the cut off lines CL1 and CL2 thereof are formed by the basic light distribution pattern PL0.

The additional light distribution pattern PLA is formed as a spot-shaped light distribution pattern for enhancing the brightness of the central area (i.e., the area surrounding the elbow point E) of the basic light distribution pattern PL0.

The additional light distribution pattern PLA is formed by turning ON a plurality of light emitting diodes 22 that constitutes a substantially upper half area of the light emitting area 20A. That is, the additional light distribution pattern PLA is formed as an aggregate of the light source images Pa as the inverted projection image of the light emitting diode 22 in the turn-on state. At this time, the position of the boundary between the area in which the light emitting diode 22 is turned-ON and the area in which the light emitting diode 22 is not turned-ON in the light emitting area 20A is set to a position corresponding to the cut off lines CL1 and CL2.

The high beam light distribution pattern PH illustrated in FIG. 6B is formed as a combined light distribution pattern of the basic light distribution pattern PL0 formed by irradiation light from the another lamp unit and an additional light distribution pattern PHA formed by irradiation light from the lamp unit 100.

The basic light distribution pattern PH0 is a light distribution pattern that forms a basic shape of the high beam light distribution pattern PH, and is formed as a light distribution pattern in which the basic light distribution pattern PL0 extends to a position above the cut off lines CL1 and CL2.

The additional light distribution pattern PHA is formed as a spot-shaped light distribution pattern for enhancing the brightness of the central area (i.e., the area surrounding the vanishing point H-V) of the basic light distribution pattern PH0.

The additional light distribution pattern PHA is formed as an aggregate of the light source images Pa as the inverted projection image, by turning-ON all of the plurality of light emitting diodes 22 that constitute the light emitting area 20A.

Subsequently, an action of the present embodiment will be described.

In the electronic component mounting substrate 10 according to the present embodiment, the electronic component 20 and the substrate 30 are electrically connected at the plurality of places on the bottom surface 20b of the electronic component 20. However, the electrical connections at the four places at the four corners in a diagonal positional relationship with each other with respect to the central position of the bottom surface 20b of the electronic component 20 are not performed by soldering, but performed by the bonding using the conductive adhesive 50, and thus, the following operation effect may be obtained.

Figure 7A:
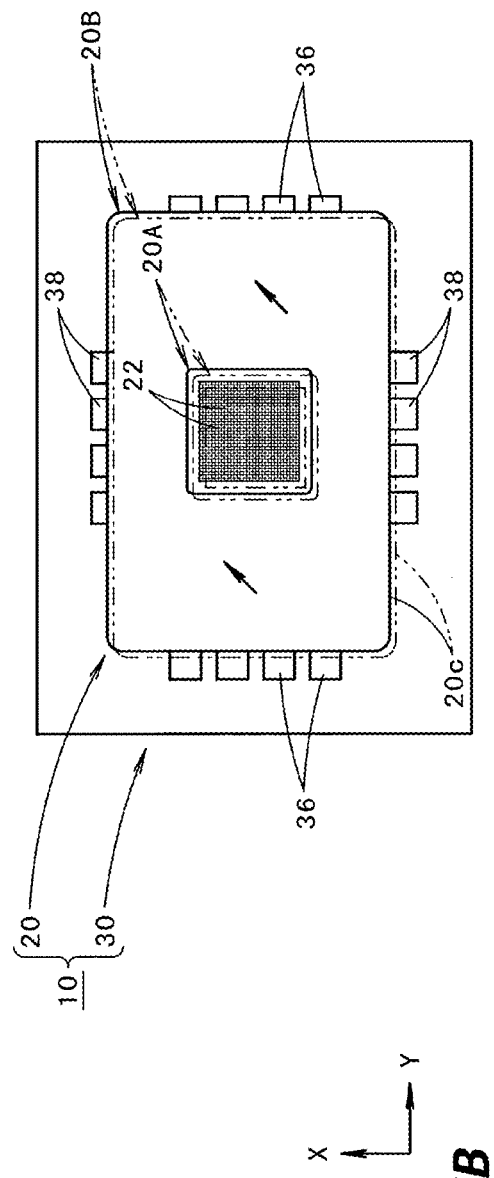
FIGS. 7A and 7B are plan views for explaining action of the first embodiment.
Figure 7B:
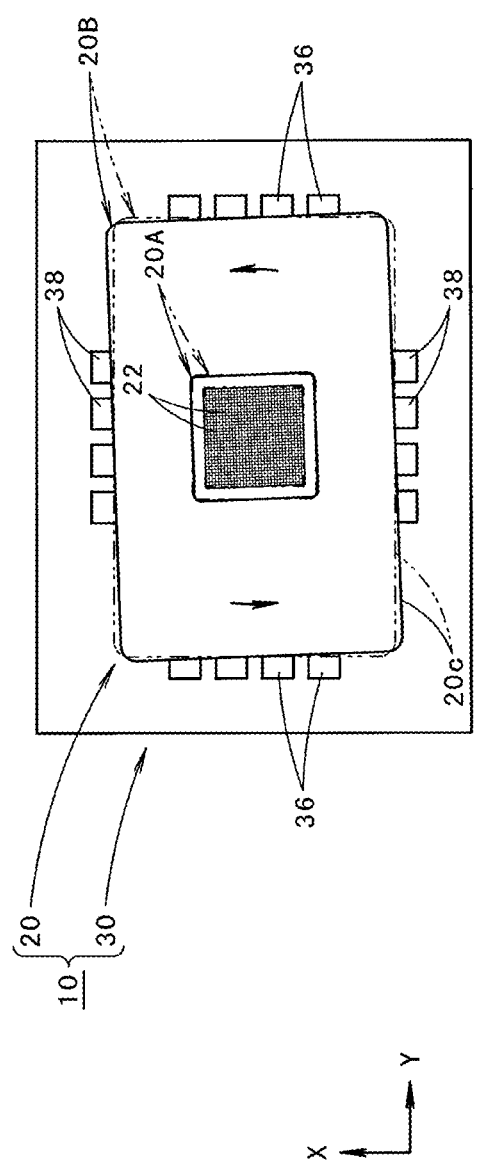

That is, if it is assumed that the bonding using the conductive adhesive 50 is not performed, when soldering the electronic component 20 and the substrate 30 by the reflow processing, the solder 40 in a liquid phase tends to be spread on the substrate 30 and the surface tension thereof acts on the electronic component 20. As a result, as illustrated in FIG. 7A, the electronic component 20 may be shifted in a translation direction from an intended mounting position (i.e., the position indicated by a two-dot chain line), or as illustrated in FIG. 7B, the electronic component 20 may be shifted in a rotation direction from an intended mounting position (i.e., the position indicated by a two-dot chain line).

However, in the present embodiment, when soldering the electronic component 20 and the substrate 30 by the reflow processing, even if the solder 40 in a liquid phase tends to be spread on the substrate 30 and the surface tension thereof acts on the electronic component 20, the electronic component 20 is also fixed to the substrate 30 by the bonding using the conductive adhesive 50, and thus, it is possible to suppress in advance the electronic component 20 from being shifted from an intended mounting position.

At this time, since the electrical connection by the bonding using the conductive adhesive 50 is performed at the four places (i.e., at least two places), it is possible to not only suppress the electronic component 20 from shifting from the intended mounting position in the translation direction, but also suppress the shift in the rotation direction. Then, therefore, it is possible to improve the mounting position accuracy of the electronic component 20.

As described above, according to the present embodiment, it is possible to improve the mounting position accuracy of the electronic component 20 in the electronic component mounting substrate 10 in which the electronic component 20 and the substrate 30 are electrically connected at the plurality of places on the bottom surface 20b of the electronic component 20.

In addition, the following operation effect may be obtained by using both the soldering and the bonding using the conductive adhesive 50 as means for the electrical connection as in the present embodiment.

That is, if all of the electrical connections at the plurality of places are performed by the bonding using the conductive adhesive 50, it is possible to improve the mounting position accuracy of the electronic component 20. However, the electrical connection by the bonding using the conductive adhesive 50 requires a higher manufacturing cost than the electrical connection by the soldering. Therefore, by using both the soldering and the bonding using the conductive adhesive 50, it is possible to improve the mounting position accuracy of the electronic component 20 while suppressing the manufacturing cost of the electronic component mounting substrate 10.

In the present embodiment, the four places are set to the positions including the two places positioned at opposite sides with respect to the central position of the bottom surface 20b of the electronic component 20, and thus, the electrical connection by the bonding using the conductive adhesive 50 is performed at the four places that are far apart from each other. Therefore, it is possible to improve the mounting position accuracy of the electronic component 20 while suppressing the number of places where the electrical connection by the bonding using the conductive adhesive 50 is applied.

In addition, in the present embodiment, since the four places are positioned at the four corners in a diagonal positional relationship with each other with respect to the central position of the bottom surface 20b of the electronic component 20, it is possible to maximize the mounting position accuracy of the electronic component 20 without unnecessarily increasing the number of places where the electrical connection by the bonding using the conductive adhesive 50 is applied.

In the present embodiment, since the organic binder having the thermosetting temperature lower than the melting point of the solder 40 used in the soldering is used as an organic binder of the conductive adhesive 50, during the reflow processing, it is possible to reliably fix the electronic component 20 to the substrate 30 by the bonding using the conductive adhesive 50 before the solder 40 becomes a liquid phase, and thus, it is possible to further improve the mounting position accuracy of the electronic component 20.

Particularly, since the electronic component mounting substrate 10 according to the present embodiment is provided as a light source module in the lamp unit 100 of a vehicle headlamp, when the electronic component 20 is shifted in the translation direction or in the rotation direction from the intended mounting position, the upper end edge of the additional light distribution pattern PLA in the low beam light distribution pattern PL is shifted from the position of the cut off lines CL1 and CL2, and thus it causes occurrence of glare or lowering of front visibility. Therefore, it is particularly effective to improve the mounting position accuracy of the electronic component 20 by using both the soldering and the bonding using the conductive adhesive 50 as means for the electrical connection as in the present embodiment.

In the above first embodiment, it has been described that the bonding using the conductive adhesive 50 is performed at the four places at the four corners in a diagonal positional relationship with each other with respect to the central position of the bottom surface 20b of the electronic component 20. However, it is possible to adopt a configuration in which, for example, the bonding using the conductive adhesive 50 is performed at two places in a diagonal positional relationship with each other with respect to the central position among the four corners on the bottom surface 20b of the electronic component 20.

In the above first embodiment, the case where the electronic component mounting substrate 10 is used as a light source module provided in the lamp unit 100 of a vehicle headlamp has been described. However, the electronic component mounting substrate 10 may be used for other purposes.

Next, a modification of the first embodiment will be described.

First, a first modification of the first embodiment will be described.

Figure 8:
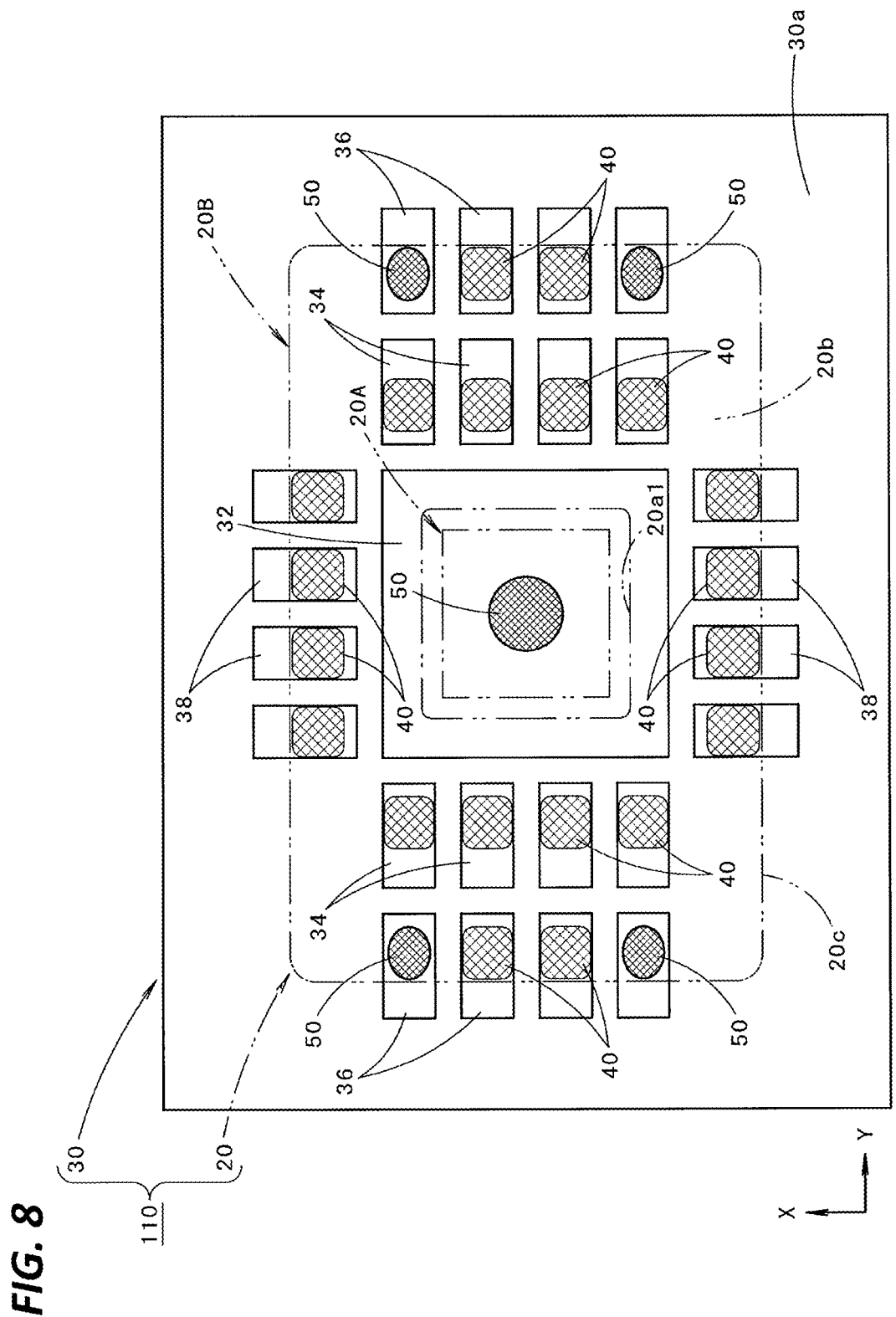
FIG. 8 is a view illustrating a first modification of the first embodiment, which is similar to FIG. 4.

FIG. 8 is a view illustrating an electronic component mounting substrate 110 according to the present modification, similar to FIG. 4.

As illustrated in FIG. 8, the basic configuration of the modification is similar to that of the first embodiment, except that the electronic component 20 is fixed to the substrate 30 at the central position of the bottom surface 20b not by the soldering, but by the bonding using the conductive adhesive 50.

The bonding using the conductive adhesive 50 is performed in an area smaller than that of the light emitting area 20A.

When supplying the conductive adhesive 50 to the land portions 36, the conductive adhesive 50 is also supplied to the land portion 32 positioned at the central portion of the substrate 30, so that the bonding using the conductive adhesive 50 is performed by the subsequent mounting of the electronic component 20 and the reflow processing.

By adopting the configuration of the present modification, the following operational effects may be obtained.

That is, since it is possible to easily secure a relatively large bonding area at the central position of the bottom surface 20b of the electronic component 20, it is possible to easily secure the adhesion able to withstand the surface tension of the solder 40 acting on the electronic component 20. Therefore, it is possible to sufficiently improve the mounting position accuracy of the electronic component 20 by adopting such the configuration.

In addition, the supply of the conductive adhesive 50 to the central position of the bottom surface 20b of the electronic component 20 may be performed simultaneously with the supply of the conductive adhesive 50 to the four places, and thus, the above operation effect may be obtained without preparing a new operation processing.

The configuration of the present modification is particularly effective when the electronic component 20 has a configuration that does not require heat radiation.

When adopting the configuration of the present modification, it is possible to adopt a configuration in which the electrical connection between the electronic component 20 and the substrate 30 is performed by fixing the electronic component 20 to the substrate 30 by the bonding using the conductive adhesive 50 at the central position of the bottom surface 20b, Subsequently, a second modification of the first embodiment will be described.

Figure 9:
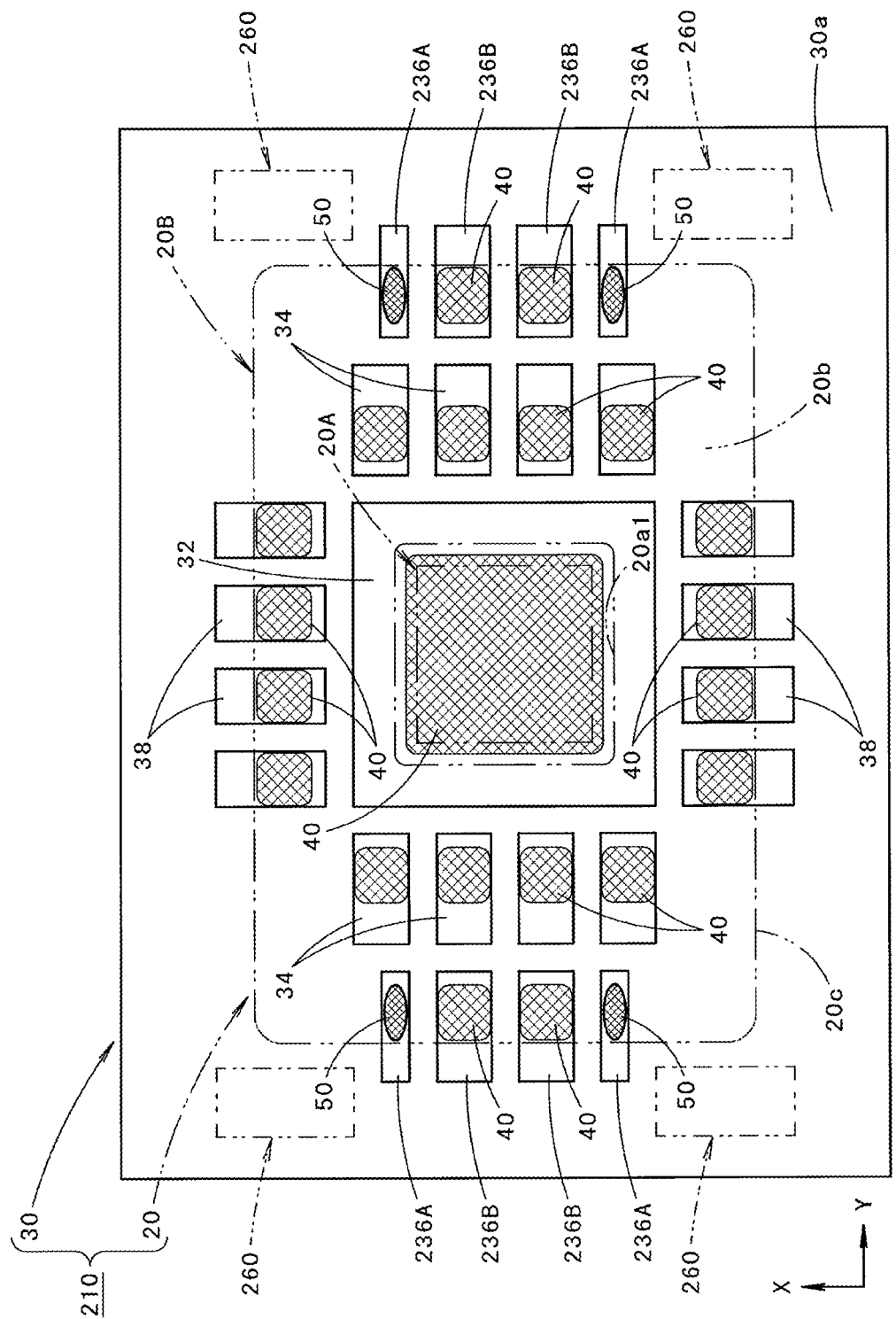
FIG. 9 is a view illustrating a second modification of the first embodiment, which is similar to FIG. 4.

FIG. 9 is a view illustrating an electronic component mounting substrate 210 according to the present modification, similar to FIG. 4.

As illustrated in FIG. 9, the basic configuration of the present modification is similar to that of the first embodiment, except that, among land portions 236A and 236B formed at eight places in front-rear rows at both left and right sides of the plurality of land portions 34, the land portions 236A (first land portions) at four places at the four corners in a diagonal positional relationship with each other with respect to the central position of the bottom surface 20b of the electronic component 20 are formed to have an area smaller than that of the land portions 236B (second land portions) at the remaining four places.

That is, the land portions 236B are formed in the same shape as the land portions of the land portions 36 of the first embodiment, but the land portions 236A are formed into a horizontally long rectangular shape having a narrow width that is approximately half of the width in the front-rear direction with respect to the land portions 236B. At this time, the distance between the land portion 236A and the land portion 236B adjacent thereto is set to be the same as in the first embodiment.

Then, in the electronic component mounting substrate 210 according to the present modification, other electronic components (e.g., ceramic condensers for noise suppression) 260 are mounted at two front-rear places on both left and right sides of the electronic component 20 on the upper surface 30a of the substrate 30. At this time, these four electronic components 260 are disposed at positions adjacent on the both left and right sides of the land portions 236A at the four places (i.e., positions opposite to the land portions 236B adjacent to the land portions 236A).

In the electronic component mounting substrate 210 according to the present modification, the bonding using the conductive adhesive 50 is performed at the land portions 236A at the four places at the four corners.

By adopting the configuration of the present modification, the space occupied by the entire of the plurality of land portions 32, 34, 236A, and 236B may be reduced, and thus, the space for mounting other electronic components 260 on the substrate 30 may be easily secured.

In the present modification, the land portions 236A on which the bonding using the conductive adhesive 50 is performed is formed to have an area smaller than that of the land portions 236B on which the soldering is performed. However, since the bonding using the conductive adhesive 50 is performed to be harder than the soldering, it is possible to have relatively small area of the interface required for the bonding. Therefore, even if the land portions 236A are formed with an area smaller than that of the land portions 236B, it is possible to easily secure necessary bonding strength.

Subsequently, a second embodiment of the present disclosure will be described.

Figure 10:
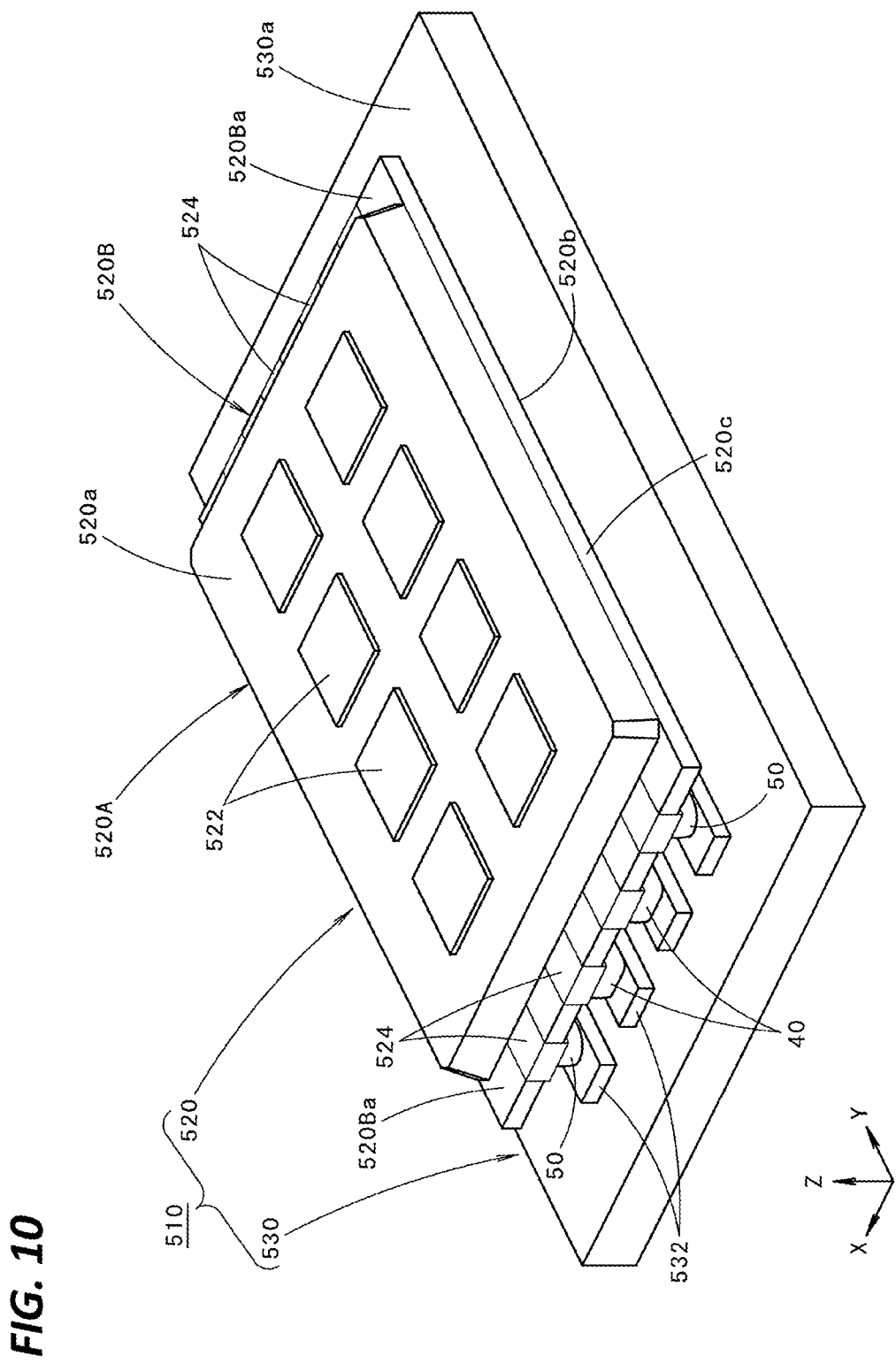
FIG. 10 is a perspective view illustrating an electronic component mounting substrate according to a second embodiment of the present disclosure.

FIG. 10 is a perspective view illustrating an electronic component mounting substrate 510 according to the present embodiment.

As illustrated in FIG. 10, the electronic component mounting substrate 510 according to the present embodiment also has a configuration in which an electronic component 520 and a substrate 530 are electrically connected at a plurality of places on a bottom surface 520b of the electronic component 520, similar to the first embodiment.

The electronic component 520 is an optical sensor unit, includes a plate-shaped body 520A having a horizontally long rectangular outer shape and a body support 520B extending in a plate shape along a lower surface of the body 520A, and has a configuration in which eight light receiving elements 522 are disposed on an upper surface 520a of the body 520A.

The eight light receiving elements 522 are disposed at an equal distance with each other in the left-right direction in two front-rear rows. Each of the light receiving elements 522 has a square outer shape and is formed in the same size.

The body 520A is formed in a truncated pyramid shape.

The body support 520B is formed in a flat-plate shape with the same front-rear width as that of the lower end surface of the body 520A, and both left and right ends thereof are formed as flange portions 520Ba protruding from the body 520A toward the both left and right sides.

In each of the flange portions 520Ba, four metal pads 524 are disposed at an equal distance in the front-rear direction. Each of the metal pads 524 are formed to be on the same plane with the upper surface and the side end surface of each of the flange portions 520Ba, but are formed to protrude downward from the lower surface of each of the flange portions 520Ba.

The substrate 530 has a horizontally long rectangular outer shape much larger than the electronic component 520, and land portions 532 are formed at eight places on an upper surface 530a of the substrate 530.

The land portions 532 are formed in four front-rear rows near each of both left and right ends of the upper surface 530a of the substrate 530. Each of the land portions 532 has a horizontally long rectangular outer shape, and is disposed at an equal distance with each other in the front-rear direction.

At this time, the distance between each of the land portions 532 in the front-rear direction is set to the same value as the distance between each of the metal pads 524 in the front-rear direction. Further, when the electronic component 520 is mounted on the substrate 530, each of the land portions 532 are configured to partially protrude from an outer periphery surface 520c of the body support 520B of the electronic component 520.

The electrical connection between the electronic component 520 and the substrate 530 is performed between the metal pads 524 at the eight places and the land portions 532 at the eight places.

Among the electrical connections at these eight places, the electrical connections between the metal pads 524 at four places at four corners in a diagonal positional relationship with each other with respect to the central position of the bottom surface 20b of the electronic component and the land portions 532 at four places corresponding thereto are performed by the bonding using a conductive adhesive 50, and the other electrical connections at the four places are performed by soldering.

The electrical connection is performed by supplying the solder 40 in a paste phase to the land portions 532 at the four places excluding the four places at the four corners on the substrate 530 and supplying the conductive adhesive 50 to the four corners on the substrate 530, and then, mounting the electronic component 520 on the substrate 530, and executing a processing in which the substrate 530 and the electronic component 520 are put into a reflow furnace and heated in this state (i.e., a reflow processing). During the reflow processing, the organic binder of the conductive adhesive 50 supplied to the four places is cured and bonded, and then, the solder 40 supplied to the remaining four places is melted and soldered.

Even when adopting the configuration of the present embodiment, the same operation effect as in the case of the first embodiment may be obtained.

The numerical values shown as specifications in each of the embodiments and the modifications thereof are merely examples, and, of course, the numerical values may be appropriately set to different values.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. An electronic component mounting substrate comprising:
    a substrate body; and
    a plurality of lands provided on the substrate body and configured to connect to a plurality of metal pads of an electronic component, respectively, on a bottom surface of the electronic component,
    wherein at least two of the plurality of lands are electrically connected to corresponding metal pads of the electronic component by bonding using a conductive adhesive, and lands other than the at least two of the plurality of lands are electrically connected to corresponding metal pads of the electronic component by soldering.

2. The electronic component mounting substrate according to claim 1, wherein the at least two places are set to two places positioned opposite to each other with respect to a central position of the bottom surface of the electronic component.

3. The electronic component mounting substrate according to claim 2, wherein the at least two places are set to four places at four corners in a diagonal positional relationship with each other with respect to the central position of the bottom surface of the electronic component.

4. The electronic component mounting substrate according to claim 1, wherein the electronic component is fixed to the substrate by the bonding using the conductive adhesive at a central position of the bottom surface of the electronic component.

5. The electronic component mounting substrate according to claim 2, wherein the electronic component is fixed to the substrate by the bonding using the conductive adhesive at a central position of the bottom surface of the electronic component.

6. The electronic component mounting substrate according to claim 3, wherein the electronic component is fixed to the substrate by the bonding using the conductive adhesive at a central position of the bottom surface of the electronic component.

7. The electronic component mounting substrate according to claim 1, wherein the conductive adhesive includes an organic binder having a thermosetting temperature lower than a melting point of solder used for the soldering.

8. The electronic component mounting substrate according to claim 2, wherein the conductive adhesive includes an organic binder having a thermosetting temperature lower than a melting point of solder used for the soldering.

9. The electronic component mounting substrate according to claim 3, wherein the conductive adhesive includes an organic binder having a thermosetting temperature lower than a melting point of solder used for the soldering.

10. The electronic component mounting substrate according to claim 4, wherein the conductive adhesive includes an organic binder having a thermosetting temperature lower than a melting point of solder used for the soldering.

11. The electronic component mounting substrate according to claim 5, wherein the conductive adhesive includes an organic binder having a thermosetting temperature lower than a melting point of solder used for the soldering.

12. The electronic component mounting substrate according to claim 6, wherein the conductive adhesive includes an organic binder having a thermosetting temperature lower than a melting point of solder used for the soldering.

13. The electronic component mounting substrate according to claim 1, wherein
    the at least two of the plurality of lands have an area smaller than that of the lands other than the at least two of the plurality of lands.

14. A method for manufacturing an electronic component mounting substrate, the method comprising:
    supplying a paste solder to a first position of a substrate and supplying a conductive adhesive to a second position of the substrate;
    mounting an electronic component on the substrate so that a bottom surface of the electronic component contacts the substrate at least at the first and second positions of the substrate; and
    heating the substrate and the electronic component so that the electronic component and the substrates are electrically connected, wherein the electronic component and the substrate are electrically connected at a plurality of places, at least two places of the plurality of places are electrically connected by bonding using the conductive adhesive, and places other than the at least two places of the plurality of places are electrically connected by soldering using the paste solder, and the conductive adhesive includes an organic binder having a thermosetting temperature lower than a melting point of the paste solder used in the soldering.

* * * * *